United States Patent
Kitzler et al.

(10) Patent No.: US 11,610,817 B2
(45) Date of Patent: Mar. 21, 2023

(54) METHOD OF PROCESSING A SEMICONDUCTOR WAFER, SEMICONDUCTOR WAFER, AND SEMICONDUCTOR DIE PRODUCED FROM A SEMICONDUCTOR WAFER

(71) Applicant: Infineon Technologies Austria AG, Villach (AT)

(72) Inventors: Andreas Kitzler, Villach (AT); John Cooper, Villach (AT); Jakob Simon Dohr, Villach (AT); Michael Knabl, Finkenstein (AT); Matic Krivec, Villach (AT); Daniel Pieber, Arnoldstein (AT)

(73) Assignee: Infineon Technologies Austria AG, Villach (AT)

( * ) Notice: Subject to any disclaimer, the term of this patent is extended or adjusted under 35 U.S.C. 154(b) by 123 days.

(21) Appl. No.: 17/206,782

(22) Filed: Mar. 19, 2021

(65) Prior Publication Data
US 2022/0301933 A1    Sep. 22, 2022

(51) Int. Cl.
*H01L 23/544* (2006.01)
*H01L 21/78* (2006.01)
*H01L 21/66* (2006.01)

(52) U.S. Cl.
CPC .............. *H01L 21/78* (2013.01); *H01L 22/32* (2013.01); *H01L 23/544* (2013.01); *H01L 2223/5446* (2013.01); *H01L 2223/54426* (2013.01)

(58) Field of Classification Search
CPC ....... H01L 21/78; H01L 22/32; H01L 23/544; H01L 2223/54426; H01L 2223/5446; H01L 21/02118; H01L 21/02288
See application file for complete search history.

(56) References Cited

U.S. PATENT DOCUMENTS

| | | |
|---|---|---|
| 8,912,637 B1 | 12/2014 | Zhang |
| 2011/0159256 A1 | 6/2011 | Arana et al. |
| 2013/0234160 A1* | 9/2013 | Matsuno ............... H01L 21/045 257/77 |
| 2014/0113435 A1 | 4/2014 | Peddi et al. |
| 2015/0064879 A1 | 3/2015 | Engelhardt et al. |
| 2020/0203295 A1 | 6/2020 | Sada et al. |
| 2021/0020514 A1* | 1/2021 | Seddon ............... H01L 21/3065 |
| 2021/0074844 A1* | 3/2021 | Kojima ............... H01L 29/7809 |

* cited by examiner

*Primary Examiner* — Thanh T Nguyen
(74) *Attorney, Agent, or Firm* — Murphy, Bilak & Homiller, PLLC (57) ABSTRACT

A method of processing a semiconductor wafer includes: forming a first metal layer or metal layer stack on a backside of the semiconductor wafer; forming a plating preventative layer on the first metal layer or metal layer stack, the plating preventative layer being formed at least over a kerf region of the semiconductor wafer and such that part of the first metal layer or metal layer stack is uncovered by the plating preventative layer, wherein the kerf region defines an area for dividing the semiconductor wafer along the kerf region into individual semiconductor dies; and plating a second metal layer or metal layer stack on the part of the first metal layer or metal layer stack uncovered by the plating preventative layer, wherein the plating preventative layer prevents plating of the second metal layer or metal layer stack over the kerf region.

19 Claims, 10 Drawing Sheets

Figure 6

METHOD OF PROCESSING A SEMICONDUCTOR WAFER, SEMICONDUCTOR WAFER, AND SEMICONDUCTOR DIE PRODUCED FROM A SEMICONDUCTOR WAFER

BACKGROUND

High power semiconductor devices such as IGBTs (insulated gate bipolar transistors), power MOSFETs (metal-oxide-semiconductor field-effect transistors), diodes, etc. are designed to support high voltages and large currents. To achieve highest current density, vertical device designs are used. Vertical power semiconductor devices require a backside metallization, which not only fulfils the function of electrical contact to a base plate, lead frame, etc. but also must satisfy various requirements regarding assembly and product reliability.

An inexpensive, universally applicable metallization for bonding, soldering and sintering processes is desired. Due to considerations such as cost and scaling, metallizations are often processed in a plating deposition process. Electroless plated NiP/Pd metal stack is just one example. Thickness of the plated backside metallization can range from a few hundred nanometers to 5000 nm or even greater, e.g., 1500 nm, 1700 nm, 3500 nm.

Particularly for double-sided plated products, at least two major problems arise from increased metallization thicknesses: sawing/dicing quality and wafer warpage.

For improved sawing quality, mechanical dicing blades with very small diamonds incorporated in a bond material are used. Since the backside of a wafer is usually not structured, the dicing blade must separate the complete silicon-metal stack. Due to proven loss in die (chip) strength, alternate separation processes such as laser dicing are often not an option. Conventional mechanical dicing processes perform best when sawing through a single material only. However, a silicon-metal stack is a multiple component system with various mechanical properties. Whereas silicon is rather brittle and crumbles during dicing, metal is sheared-off and may clog the diamonds that serve as abrasive particles. A certain ratio between silicon and metal thickness is required to achieve a self-cleaning effect of the dicing blade during sawing. With thicker metallization, or rather smaller silicon to metal ratio, the smearing effect eventually leads to blade clogging which reduces dicing quality.

In a double-sided plating process, metallization is deposited simultaneously on exposed metal surfaces on both, the frontside and backside of a wafer. Ideally the stress on the front and back sides cancel each other out. However, due to different metallization patterns and open areas at the front and back sides of the wafer, the deposition rate is not equal between the two sides and a stress mismatch occurs. This leads to wafer warpage, making it difficult or even impossible to handle the wafers.

Thus, there is a need for an improved approach for producing double-sided plated semiconductor wafers.

SUMMARY

According to an embodiment of a method of processing a semiconductor wafer, the method comprises: forming a first metal layer or metal layer stack on a backside of the semiconductor wafer; forming a plating preventative layer on the first metal layer or metal layer stack, the plating preventative layer being formed at least over a kerf region of the semiconductor wafer and such that part of the first metal layer or metal layer stack is uncovered by the plating preventative layer, wherein the kerf region defines an area for dividing the semiconductor wafer along the kerf region into individual semiconductor dies; and plating a second metal layer or metal layer stack on the part of the first metal layer or metal layer stack uncovered by the plating preventative layer, wherein the plating preventative layer prevents plating of the second metal layer or metal layer stack over the kerf region.

According to an embodiment of a semiconductor wafer, the semiconductor wafer comprises: a semiconductor material; a first metal layer or metal layer stack formed on a backside of the semiconductor material; a plating preventative layer formed on the first metal layer or metal layer stack at least over a kerf region of the semiconductor wafer such that part of the first metal layer or metal layer stack is uncovered by the plating preventative layer; and a second metal layer or metal layer stack plated on the part of the first metal layer or metal layer stack uncovered by the plating preventative layer, wherein the plating preventative layer keeps the kerf region free from the second metal layer or metal layer stack.

According to an embodiment of a semiconductor die, the semiconductor die comprises: a semiconductor substrate; a first metal layer or metal layer stack formed on a backside of the semiconductor substrate; a plating preventative layer formed on the first metal layer or metal layer stack at least over a periphery region of the backside such that at least part of the first metal layer or metal layer stack spaced inward from the periphery region is uncovered by the plating preventative layer; and a second metal layer or metal layer stack plated on the part of the first metal layer or metal layer stack uncovered by the plating preventative layer.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein are embodiments of semiconductor wafers and methods of producing semiconductor wafer according to which a structured backside metallization is formed outside the kerf region. The embodiments described herein allow for an improved dicing process for a wide range of products. The embodiments described herein also reduce the open area mismatch between front and back side metallizations of the semiconductor wafer, thereby reducing wafer bow. The embodiments described herein include forming a plating preventative layer that prevents metal plating over the kerf region of the semiconductor wafer, thus providing for a less complex, faster, and less expensive die (chip) separation process whereby a dicing blade does not have to cut through a plated metal layer or metal layer stack.

Described next, with reference to the figures, are exemplary embodiments of producing a semiconductor wafer with the plating preventative layer formed on the backside of the wafer. Not all details are shown in each figure. In some cases, the figures are simplified to emphasize certain features. For example, FIGS. 1, 3A-3D and 4 do not show the wafer frontside structuring.

Figure 1:
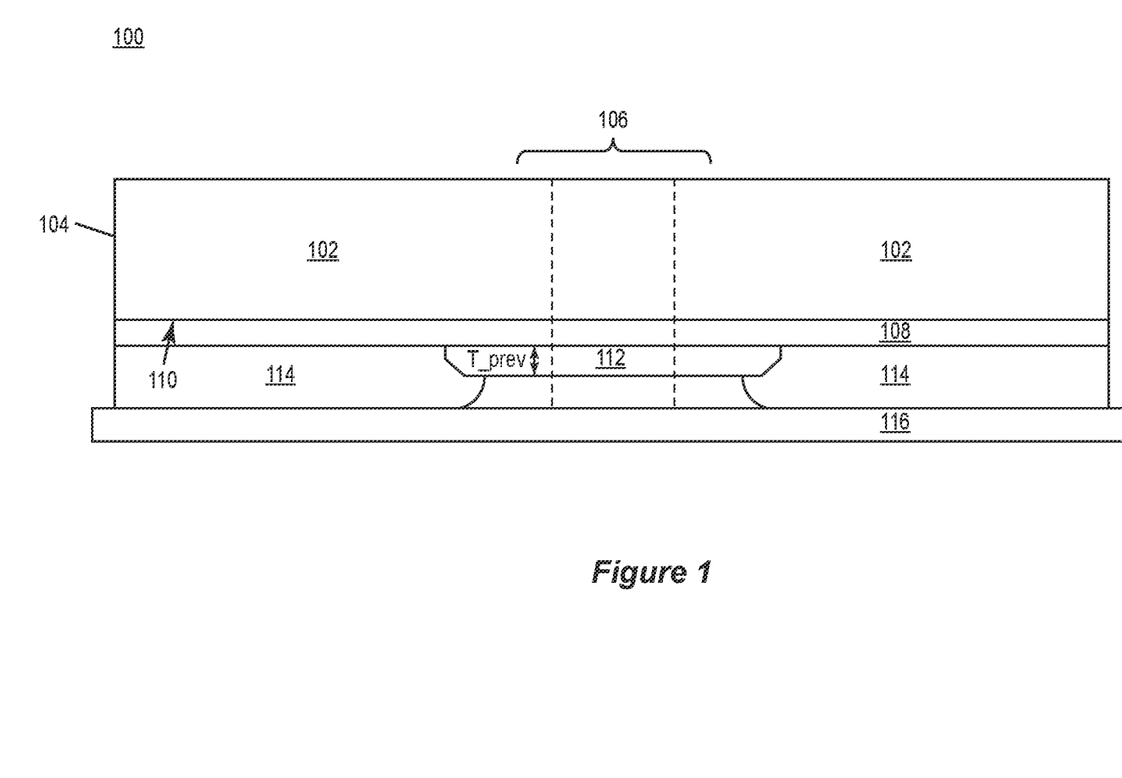
FIG. 1 illustrates a partial cross-sectional of an embodiment of a semiconductor wafer in a region of two neighboring dies.

FIG. 1 illustrates a partial cross-sectional view of a semiconductor wafer 100 in a region of two neighboring dies 102. The semiconductor wafer 100 has yet to be singulated (divided) and thus the dies 102 remain interconnected by a common semiconductor material 104 of the wafer 100. The semiconductor material 104 may be any type of semiconductor material such as but not limited to Si, SiC, GaN, etc.

The semiconductor wafer 100 may be a thin wafer or a thick wafer. Accordingly, the semiconductor material 104 may have any thickness. In one embodiment, the semiconductor material 104 has a thickness of 200 µm or less.

The semiconductor wafer 100 may be used in low voltage silicon IGBT/diode products having a semiconductor material thickness, e.g., in a range of 50 to 120 µm. However, the semiconductor wafer 100 instead may be used in high voltage products having a semiconductor material thickness, e.g., of about 350 µm or greater. In another example, the semiconductor wafer 100 may be used in SiC products having a semiconductor material thickness in a range of 50 to 110 µm. In yet another example, the semiconductor wafer 100 may be used in Si-based MOSFET products which may be thinner than the previously mentioned SiC products.

A kerf region 106 defines an area for dividing the semiconductor wafer 100 along the kerf region 106 into individual semiconductor dies 102. The pair of dashed vertical lines in FIG. 1 indicate a dicing street associated with the kerf region 106 and through which a dicing blade cuts the semiconductor wafer 100 to singulate the semiconductor dies 102.

Prior to singulation, a first metal layer or metal layer stack 108 is formed on the backside 110 of the semiconductor material 104. In one embodiment, the first metal layer or metal layer stack 108 comprises one or more selected from the group consisting of: Al, Cu, Ti, W, Mo, Cr, Ni, Ag, Au, Pt, Pd, Sn, Zn, and alloys thereof.

The semiconductor wafer 100 also includes a plating preventative layer 112 formed on the first metal layer or metal layer stack 108 at least over the kerf region 106 such that part of the first metal layer or metal layer stack 108 is uncovered by the plating preventative layer 112. The plating preventative layer 112 fully prevents metal plating during a subsequent plating process, or as shown in FIG. 1, retards or impedes metal plating such that metal is not plated at least along the kerf region 106 during the subsequent plating process. In one embodiment, the plating preventative layer 112 is an oxide layer. In another embodiment, the plating preventative layer 112 comprises a polymer such as polyimide. In the case of a polymer, the plating preventative layer 112 may be an organic polymer. In the case of a non-organic polymer, the plating preventative layer 112 may comprise silicone.

The semiconductor wafer 100 also includes a second metal layer or metal layer stack 114 plated on the part of the first metal layer or metal layer stack 108 uncovered by the plating preventative layer 112. As shown in FIG. 1, the plated metal layer or metal layer stack 114 may have some degree of lateral extension onto the plating preventative layer 112. The degree of lateral extension depends on several factors, including the type and duration of the plating process, the thickness and composition of the plated metal layer or metal layer stack 114, and the thickness and composition of the plating preventative layer 112. However, even if the plated metal layer or metal layer stack 114 laterally extends onto the plating preventative layer 112, the plating preventative layer 112 retards or impedes the plating process such that the first metal layer or metal layer stack 108 is not plated at least along the kerf region 106. Accordingly, the plating preventative layer 112 keeps the kerf region 106 free from plated metal.

In one embodiment, the second (plated) metal layer or metal layer stack 114 comprises one or more selected from the group consisting of: Ni, NiP, NiMoP, NiB, NiWP, Ag, AgP, Cu, Pd, PdP, Au, Sn, Pt, CoW, In, Ir, Ru, Rh, and alloys thereof.

Separately or in combination, the plating preventative layer 112 may be thinner than the second metal layer or metal layer stack 114. Such a configuration allows for backside electrical contact of the semiconductor wafer 100 via a test equipment chuck 116, as shown in FIG. 1. The first metal layer or metal layer stack 108 formed on the backside 110 of the semiconductor material 104 provides a common electrical connection to the backside of each semiconductor die 102, since the underlying first metal layer or metal layer stack 108 remains intact prior to wafer singulation. In one embodiment, the first metal layer or metal layer stack 108 has a thickness up to 5 µm, the second (plated) metal layer or metal layer stack 114 has a thickness up to 20 µm, and the plating preventative layer 112 has a thickness of at least 100 nm but thinner than the second metal layer or metal layer stack 114. However, these are just example thicknesses. In the case of electroless plated NiP/Pd as the second metal layer or metal layer stack 114, the thickness of the second metal layer or metal layer stack 114 may range from a few hundred nanometers up to 5000 nm or even greater, e.g., 1500 nm, 1700 nm or 3500 nm.

Separately or in combination, a hardness of the second (plated) metal layer or metal layer stack 114 is different than a hardness of the first metal layer or layer stack 108 where 'hardness' is a measure of the resistance to localized plastic deformation. In one embodiment, the second metal layer or metal layer stack 114 is harder than the first metal layer or layer stack 108. For example, the first metal layer or layer stack 108 may be a sputtered and/or evaporated metal stack of Al/Ti/AlSiCu and the second metal layer or metal layer stack 114 may be a plated metal stack of NiP/Pd. Hard metals are more critical for dicing processes. However, even extremely soft metals may be difficult to separate, creating other problems such as clogging of the dicing blade. Hence, the first metal layer or layer stack 108 instead may be harder than the second metal layer or metal layer stack 114. In each case, the plating preventative layer 112 prevents plated metal from being formed at least over the kerf region 106 of the semiconductor wafer 100.

Figure 2:
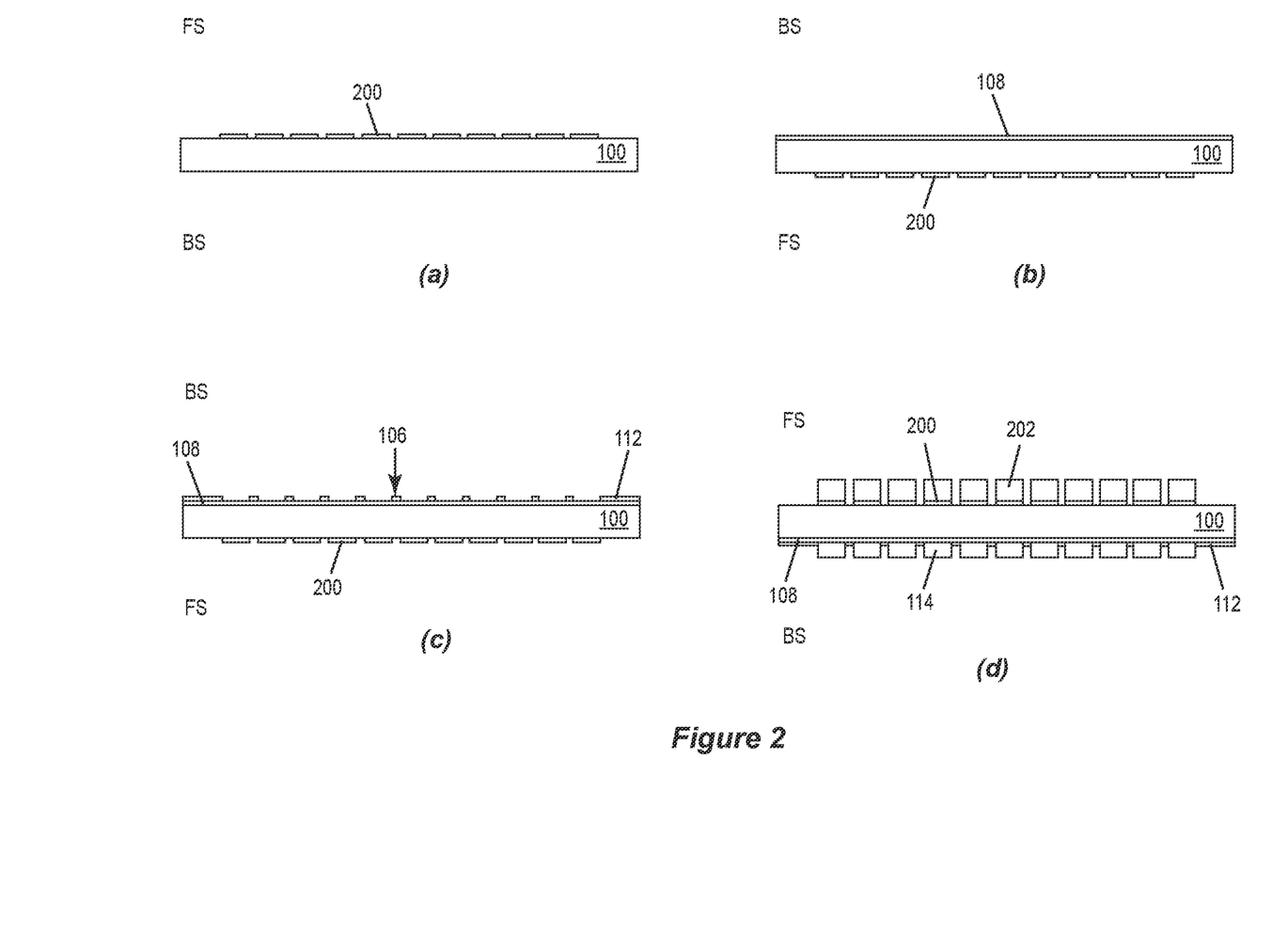
FIG. 2 illustrates an embodiment of a method of processing the semiconductor wafer.

FIG. 2 illustrates an embodiment of a method of processing the semiconductor wafer 100. FIG. 2 shows the frontside (FS) and backside 110 (or BS in FIG. 2) of the semiconductor wafer 100 during different stages of processing.

Block (a) in FIG. 2 shows a front-side metallization 200 formed on the frontside of the semiconductor wafer 100. The front-side metallization 200 is shown in a simplified manner in FIG. 2, and may include one or more patterned metallization layers separated from each other and from the semiconductor wafer 100 by an interlayer dielectric material such as $SiO_2$. Device structures are formed in the frontside of the semiconductor wafer 100 before the front-side metallization 200 is formed. Device formation may include epitaxial processing, frontside implantation and annealing, trench etching and filling, etc.

Block (b) in FIG. 2 shows the semiconductor wafer 100 after forming the first metal layer or metal layer stack 108 on the backside 110 ('BS' in FIG. 2) of the semiconductor wafer 100. The first metal layer or metal layer stack 108 may be formed, e.g., by sputtering and/or evaporation. In one embodiment, the first metal layer or metal layer stack 108 is formed by sputtering and/or evaporating one or more of: Al, Cu, Ti, W, Mo, Cr, Ni, Ag, Au, Pt, Pd, Sn, Zn, and alloys thereof onto the backside 110 of the semiconductor wafer 100. For example, the first metal layer or metal layer stack 108 may comprise a sputtered metal stack of Al/Ti/AlSiCu.

Block (c) in FIG. 2 shows the semiconductor wafer 100 after forming the plating preventative layer 112 on the first metal layer or metal layer stack 108. As previously described herein, the plating preventative layer 112 is formed at least over the kerf region 106 of the semiconductor wafer 100 such that part of the first metal layer or metal layer stack 108 is uncovered by the plating preventative layer 112.

Block (d) in FIG. 2 shows the semiconductor wafer 100 after the second metal layer or metal layer stack 114 is plated on the part of the first metal layer or metal layer stack 108 uncovered by the plating preventative layer 112. Similarly, a metal layer or metal layer stack 202 may be plated on the frontside metallization 200 at the frontside of the semiconductor wafer 100. Between the frontside metallization processing shown in block (a) of FIG. 2 and the backside metallization processing shown in block (b) of FIG. 2, additional wafer processing may be performed such as thinning of the semiconductor wafer 100, backside implantation and annealing, etc.

The plating preventative layer 112 prevents metal plating at least over the kerf region 106. As previously described herein, the plating preventative layer 112 may be an oxide layer, a polymer, etc. In the case of a polymer, the plating preventative layer 112 may be an organic polymer. In the case of a non-organic polymer, the plating preventative layer 112 may comprise silicone. The plating preventative layer 112 may be thinner than the plated metal layer or metal layer stack 112. The hardness of the second (plated) metal layer or metal layer stack 114 may be different than the hardness of the first metal layer or layer stack 108. In one embodiment, the second metal layer or metal layer stack 114 may be electroless plated on the part of the first metal layer or metal layer stack 108 uncovered by the plating preventative layer 112. The second metal layer or metal layer stack 114 may comprise one or more of: Ni, NiP, NiMoP, NiB, NiWP, Ag, AgP, Cu, Pd, PdP, Au, Sn, Pt, CoW, In, Ir, Ru, Rh, and alloys thereof.

The frontside metallization 200 may be structured whereas the backside metallization is conventionally unstructured. For example, the frontside metallization 200 may have 20 to 30% structured area and 70 to 80% open (non-structured) area. According to the embodiments described herein, the plating preventative layer 112 disrupts the second (plated) metal layer or metal layer stack 114 at least along the kerf region 106 of the semiconductor wafer 100, providing better metallization area matching between the front and back sides of the semiconductor wafer 100.

The plating preventative layer 112 may disrupt the second metal layer or metal layer stack 114 outside the kerf region 106 as well, for even better metallization area matching between the front and back sides of the semiconductor wafer 100. This helps to reduce wafer bow, particularly for thicknesses of the second metal layer or metal layer stack 114 in the range of a few hundred nanometers to 5000 nm or even greater, e.g., 1500 nm, 1700 nm, 3500 nm. In the example above where the frontside metallization 200 has 20 to 30% structured area and 70 to 80% open (non-structured) area, the grid design/layout of the plating preventative layer 112 may be determined such that the second (plated) metal layer or metal layer stack 114 at the wafer backside 110 has the same or nearly same amount of structured area and open (non-structured) area, allowing for a more homogenous plated metal deposition between the two main faces of the wafer 100 and thereby reducing stress mismatch leading to decreased wafer bow. Additionally, the isolation grid formed by the plating preventative layer 112 may increase the stability of thin wafers, reducing the effective warpage after metal plating.

The semiconductor wafer 100 may be tested after backside metallization and prior to singulation of the wafer 100. Backside electrical contact of the semiconductor wafer 100 is provided via a test equipment chuck 116, e.g., as shown in FIG. 1. The thickness ('T_prev' in FIG. 1) of the plating preventative layer 112 may be equal to or less than the thickness of the second (plated) metal layer or metal layer stack 114 to allow for uniform contacting of the entire plated backside of the semiconductor wafer 100 by the chuck 116. Since the underlying first metal layer or metal layer stack 108 is intact prior to wafer singulation, current distribution during measurement and/or functional testing is ensured even for dies that might face improper contact to the chuck 116 of the test equipment. After testing, the semiconductor wafer 100 may be subsequently diced/cut along the kerf region 106 to singulate the individual semiconductor dies 102.

Figure 3A:
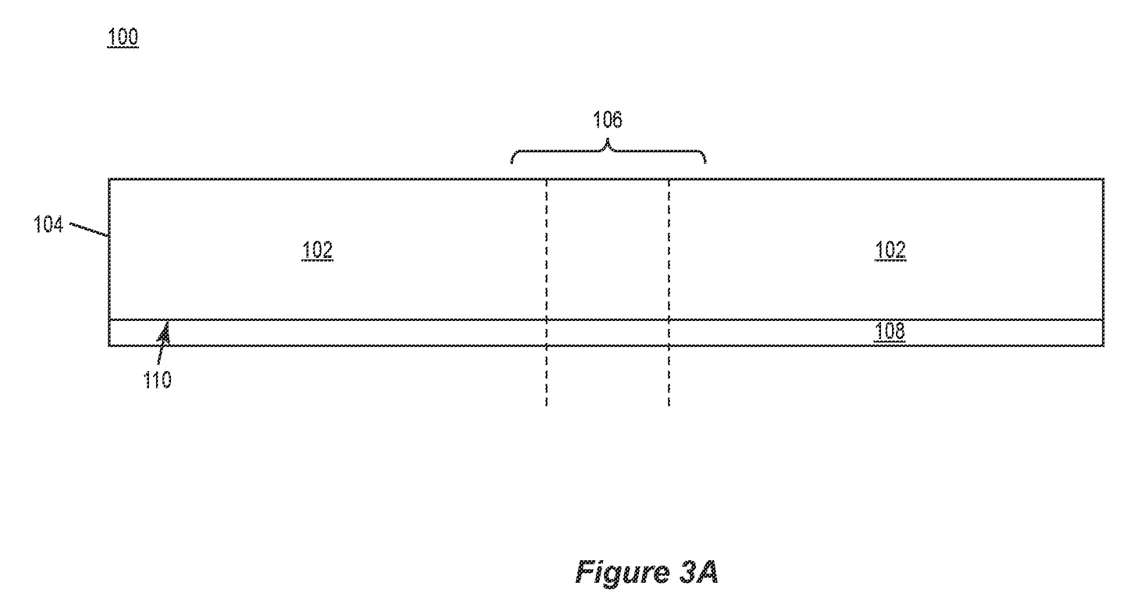
FIGS. 3A through 3D illustrate the same cross-sectional view as FIG. 1, during backside metallization and wafer dicing.
Figure 3B:
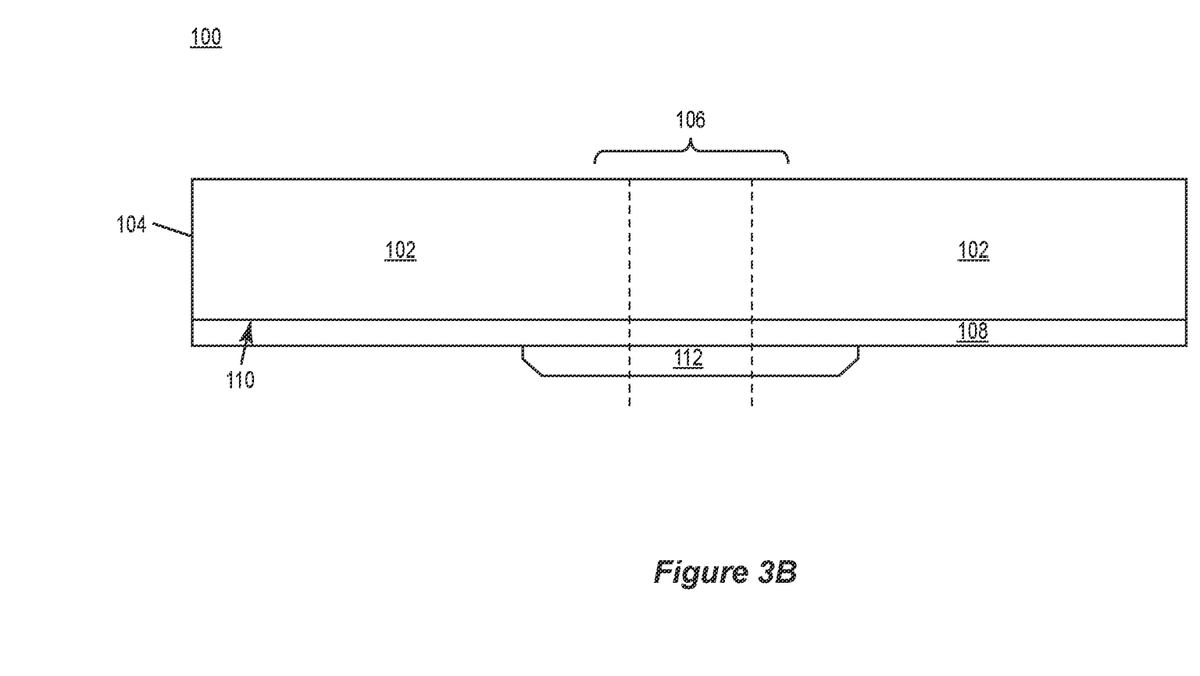
Figure 3C:
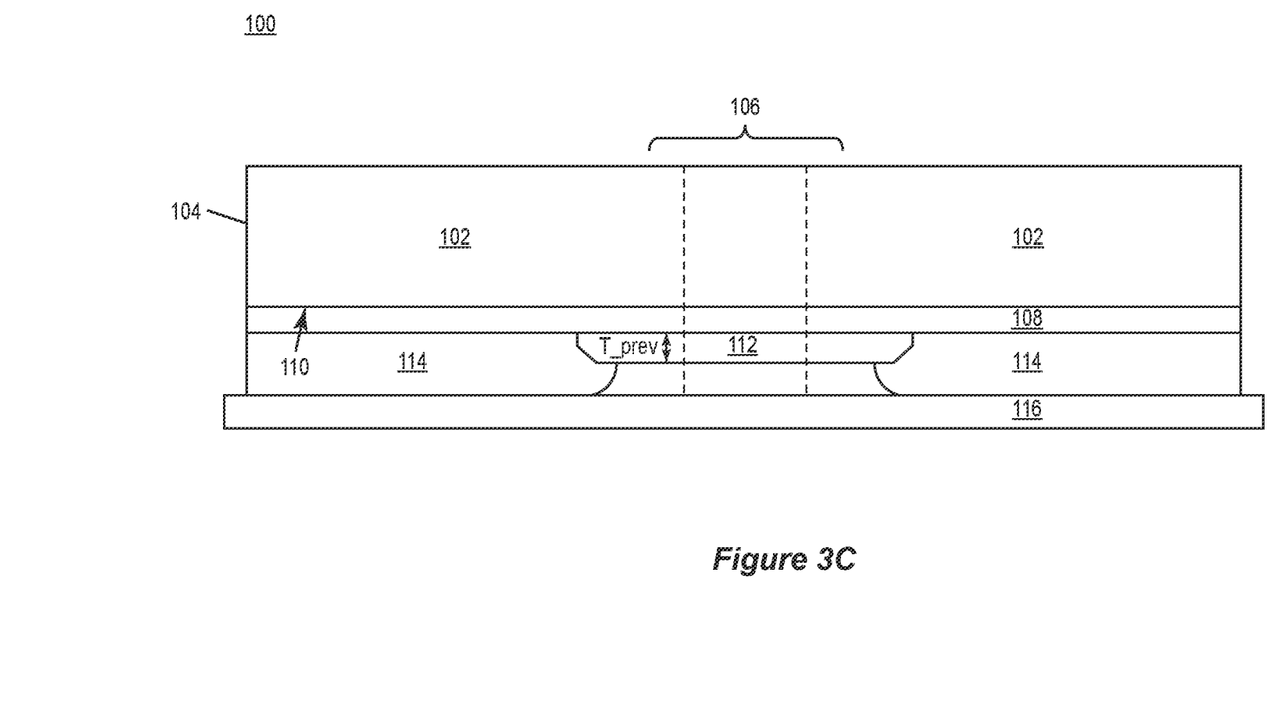
Figure 3D:
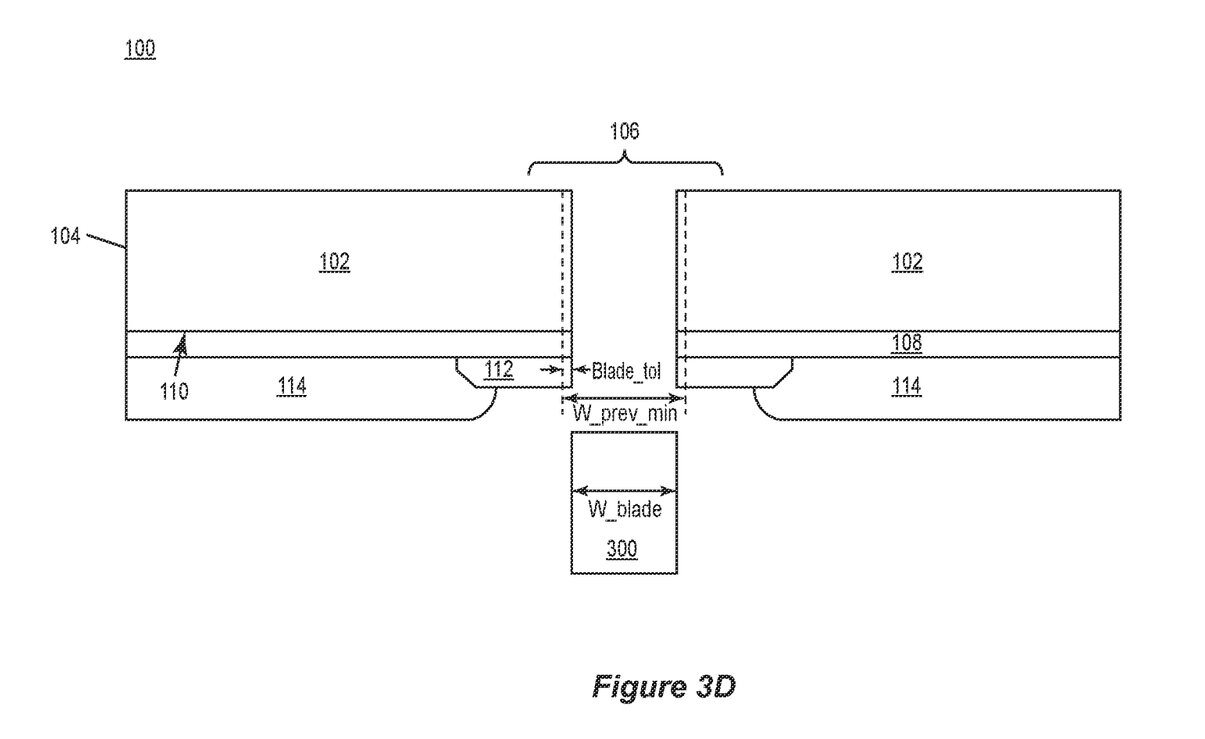

FIGS. 3A through 3D illustrate backside metallization and wafer dicing processes in the kerf region 106 between 2 adjacent semiconductor dies 102 of the semiconductor wafer 100. FIG. 3A corresponds to block (b) of FIG. 2, FIG. 3B corresponds to block (c) of FIG. 2, FIG. 3C corresponds to block (d) of FIG. 2, and FIG. 3D shows the wafer singulation process.

FIG. 3A shows the semiconductor wafer 100 after forming the first metal layer or metal layer stack 108 on the backside 110 of the semiconductor wafer 100. As previously described herein, the first metal layer or metal layer stack 108 may be formed by sputtering and/or evaporation. For example, the first metal layer or metal layer stack 108 may be formed by sputtering and/or evaporating one or more of: Al, Cu, Ti, W, Mo, Cr, Ni, Ag, Au, Pt, Pd, Sn, Zn, and alloys thereof onto the backside 110 of the semiconductor wafer 100.

FIG. 3B shows the semiconductor wafer 100 after forming the plating preventative layer 112 on the first metal layer or metal layer stack 108. The plating preventative layer 112 is formed at least over the kerf region 106 of the semiconductor wafer 100 such that part of the first metal layer or metal layer stack 108 is uncovered by the plating preventative layer 112. Any type of material that fully prevents or at least retards or impedes metal plating at least along the kerf region 106 of the semiconductor wafer 100 may be used for the plating preventative layer 112.

For example, in the case of a thick wafer 100 (e.g., more than 200 µm thick), lithography-based processing such as photoresist, masking, exposure, etching, etc. may be used to form the plating preventative layer 112. In this case, the plating preventative layer 112 may be, e.g., an oxide layer or polymeric layer. In the case of a thin wafer 100 (e.g., 200 µm or less thick), the plating preventative layer 112 may be formed by stencil printing, screen printing, inkjet printing, etc. to reduce the likelihood of wafer damage. For example, a monomer may be printed at least over the kerf region 106 of the semiconductor wafer 100 and then cured to form a polymer which may be organic or inorganic. Still other types of materials that fully prevent or at least retard or impede metal plating may be used as the plating preventative layer 112.

FIG. 3C shows the semiconductor wafer 100 after the second metal layer or metal layer stack 114 is plated on the part of the first metal layer or metal layer stack 108 uncovered by the plating preventative layer 112. The plating preventative layer 112 prevents plating of the second metal layer or metal layer stack 114 at least over the kerf region 106.

Depending on the type and duration of the plating process, the thickness and composition of the plated metal layer or metal layer stack 114, and the thickness and composition of the plating preventative layer 112, the plated metal layer or metal layer stack 114 may have some degree of lateral extension onto the plating preventative layer 112, e.g., as shown in FIG. 3C. Even if the plated metal layer or metal layer stack 114 extends laterally onto the plating preventative layer 112, the plating preventative layer 112 retards or impedes the plating process such that the second metal layer or metal layer stack 114 is not plated at least along the kerf region 106. Accordingly, the plating preventative layer 112 keeps the kerf region 106 free from plated metal. The second metal layer or metal layer stack 114 may be formed by electroplating or electroless plating, and may comprise one or more of: Ni, NiP, NiMoP, NiB, NiWP, Ag, AgP, Cu, Pd, PdP, Au, Sn, Pt, CoW, In, Ir, Ru, Rh, and alloys thereof.

Prior to wafer singulation, the backside of each semiconductor die 102 is electrically coupled to the same electric potential via the first metal layer or metal layer stack 108, allowing for an electrical test to be performed on the semiconductor wafer 100, even if every single die 102 does not have proper contact to the chuck 116. After performing the electrical test, the semiconductor wafer 100 may be subsequently singulated into individual semiconductor dies 102 along the kerf region 106.

FIG. 3D shows the semiconductor wafer 100 after singulation along the kerf region 106, thereby dividing/separating the semiconductor dies 102. Wafer singulation may be performed using a dicing blade 300. Since the plating preventative layer 112 prevents metal plating at least along the kerf region 106, the dicing blade 300 does not cut through the second (plated) metal layer or metal layer stack 114. Instead, the dicing blade 300 cuts through both the first metal layer or metal layer stack 108, which may be relatively thin compared to the second metal layer or metal layer stack 114, and through the plating preventative layer 112, which may be relatively soft compared to the second metal layer or metal layer stack 114. In one embodiment, the minimum width 'W_prev_min' of the plating preventative layer 112 is at least the width 'W_blade' of the dicing blade 300 plus tolerance 'Blade_tol' associated with inaccuracy of the sawing/dicing process.

Figure 4:
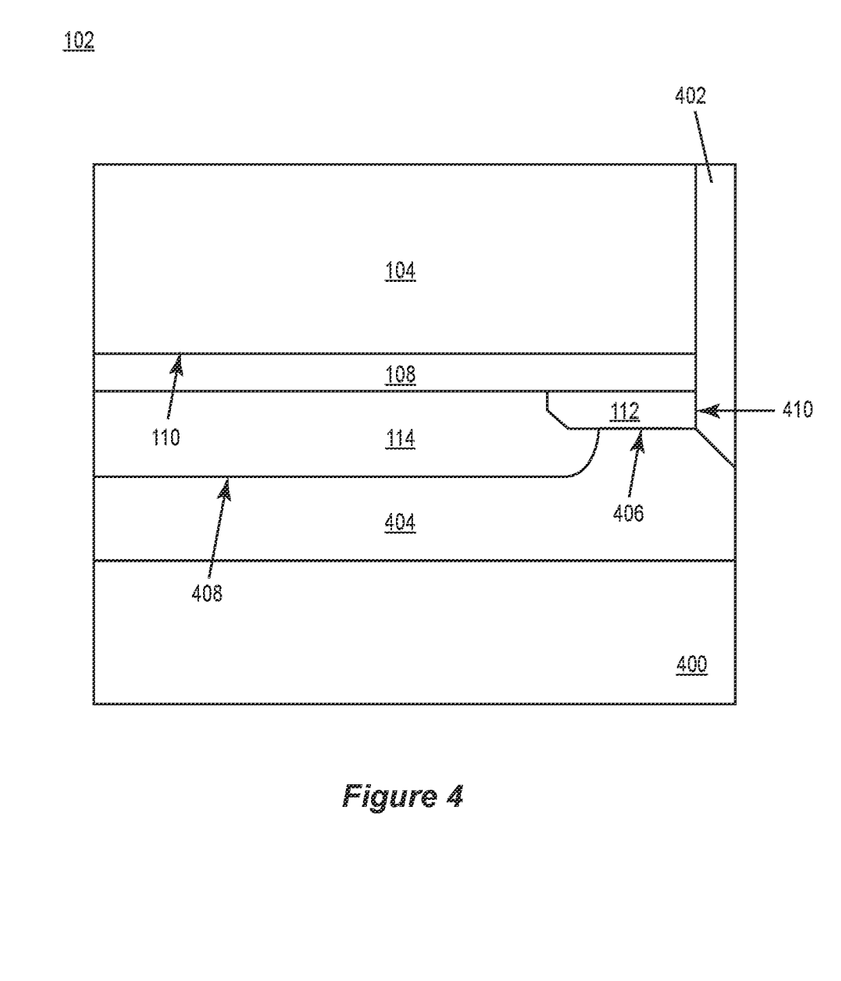
FIG. 4 illustrates a partial cross-sectional view of an edge (diced/cut) region of a semiconductor die 102 singulated from the wafer and assembled to a substrate.

FIG. 4 illustrates a partial cross-sectional view of an edge (diced/cut) region of a semiconductor die 102 singulated from the wafer 100 and assembled to a substrate 400. The semiconductor die 102 may be embedded in a molding compound 402. The semiconductor die 102 may be attached to the substrate 400 by a die attach material 404 such as solder. The die attach material 404 joins the second (plated) metal layer or metal layer stack 114 of the semiconductor die 102 to the substrate 400. The substrate 400 may be a lead frame, a printed circuit board, a DCB (direct copper bonded) substrate, an AMB (active metal brazed) substrate, an IMS (insulated metal substrate), etc. According to the embodiment illustrated in FIG. 4, the die attach material 404 contacts the entire die backside. That is, the die attach material 404 contacts both the bottom surface 406 of the plating preventative layer 112 and the bottom surface 408 of the second (plated) metal layer or metal layer stack 114. The molding compound 402 contacts the side/edge face 410 of the plating preventative layer 112 but not the bottom surface 406 of the plating preventative layer 112 in FIG. 4.

Regarding die pickup during assembly, the plating preventative layer 112 covers the first metal layer or metal layer stack 108 which should reduce or eliminate metal burrs from forming during the singulation process, thus avoiding metal burrs from digging into the sawing foil and otherwise complicating the die eject process. Additionally, and in the case of solder as the die attach material 404, the plating preventative layer 112 may act as a solder resist for preventing solder from creeping onto the die sidewalls 410.

Figure 5A:
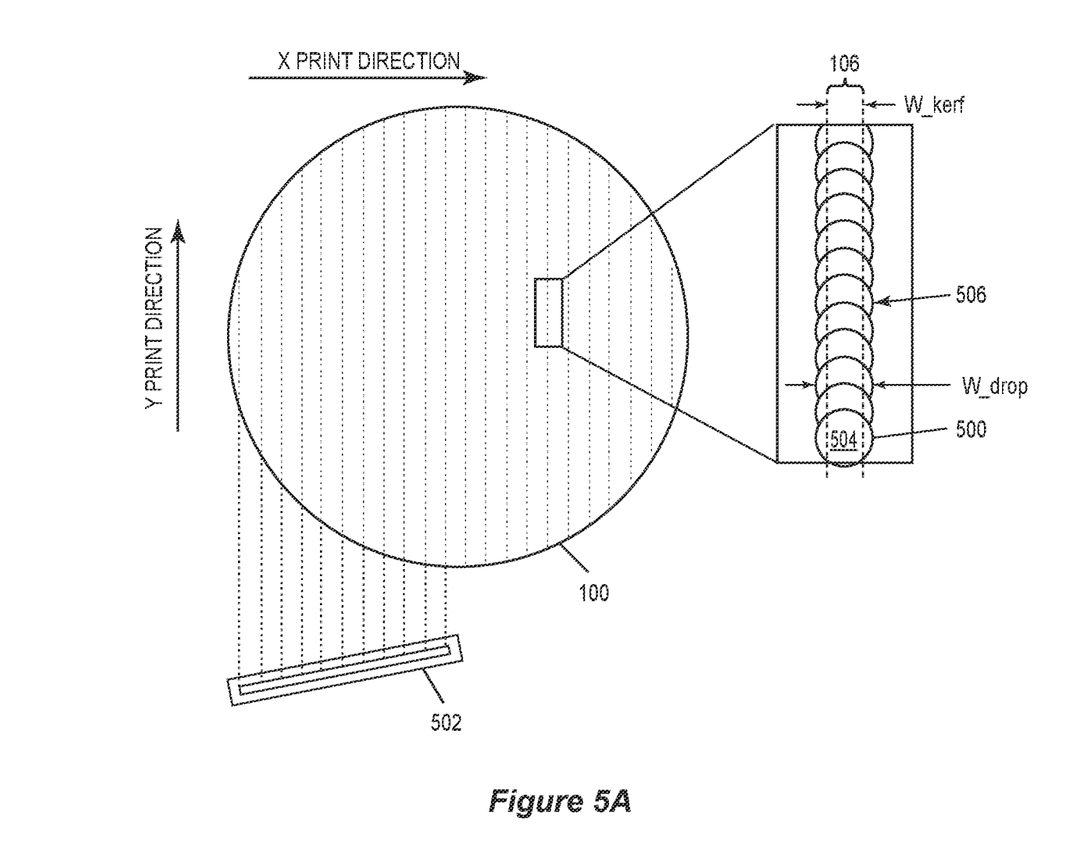
FIGS. 5A and 5B illustrate plan views of an embodiment of forming a plating preventative layer on a first metal layer or metal layer stack of the semiconductor wafer by inkjet printing.
Figure 5B:
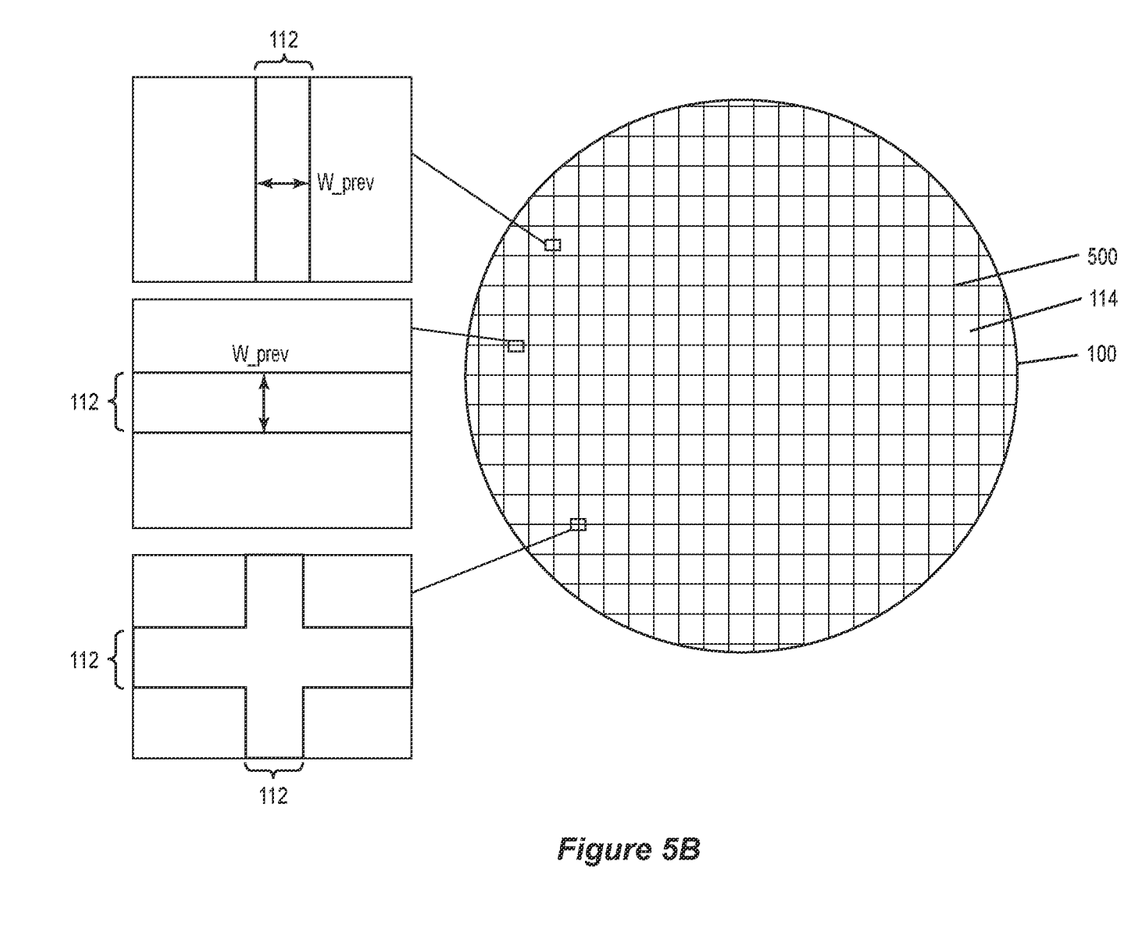

FIGS. 5A and 5B illustrate an embodiment of forming the plating preventative layer 112 on the first metal layer or metal layer stack 108 of the semiconductor wafer 100. According to this embodiment, the plating preventative layer 112 is formed by printing a plating preventative material 500 at least over the kerf region 106 of the semiconductor wafer 100. The plating preventative material 500 may be printed by stencil printing, screen printing, inkjet printing, aerosol printing or electrohydrodynamic printing.

FIG. 5A shows a print-head 502 for maskless printing of the plating preventative layer 112. The plating preventative material 500, e.g., polyimide, is deposited onto the first metal layer or metal layer stack 108 at least over the kerf region 106 of the semiconductor wafer 100. The kerf region 106 may have a width 'W_kerf', e.g., in a range of 100 to 200 µm. Each droplet 504 of the plating preventative material 500 may have a corresponding linear dimension 'W_drop' of about 100 µm. In this example, only a single or a few (e.g., 2 to 5) pixel lines 506 of the plating preventative material 500 are deposited by the print-head 502 to cover the entire kerf region 106. A single pixel line 506 is shown covering the full width of the kerf region 106 in FIG. 5A, as an example.

The print-head 502 may be rotated in a way to print several kerf lines simultaneously in x and y directions. Accordingly, only a couple of printing passes may be required for covering all kerf positions.

FIG. 5B shows the semiconductor wafer 100 after printing of the plating preventative material 500 at least over the kerf region 106 of the semiconductor wafer 100. As indicated by the 3 enlarged regions in FIG. 5B, the resulting plating preventative layer 112 may have a relatively uniform width W_prev along both the x and y printing directions and form a grid shape.

The printing process illustrated in FIGS. 5A and 5B is highly adaptable and may be easily transferred to different die types and sizes. Also, the printing process allows for back-side alignment without backside alignment markers.

Figure 6:
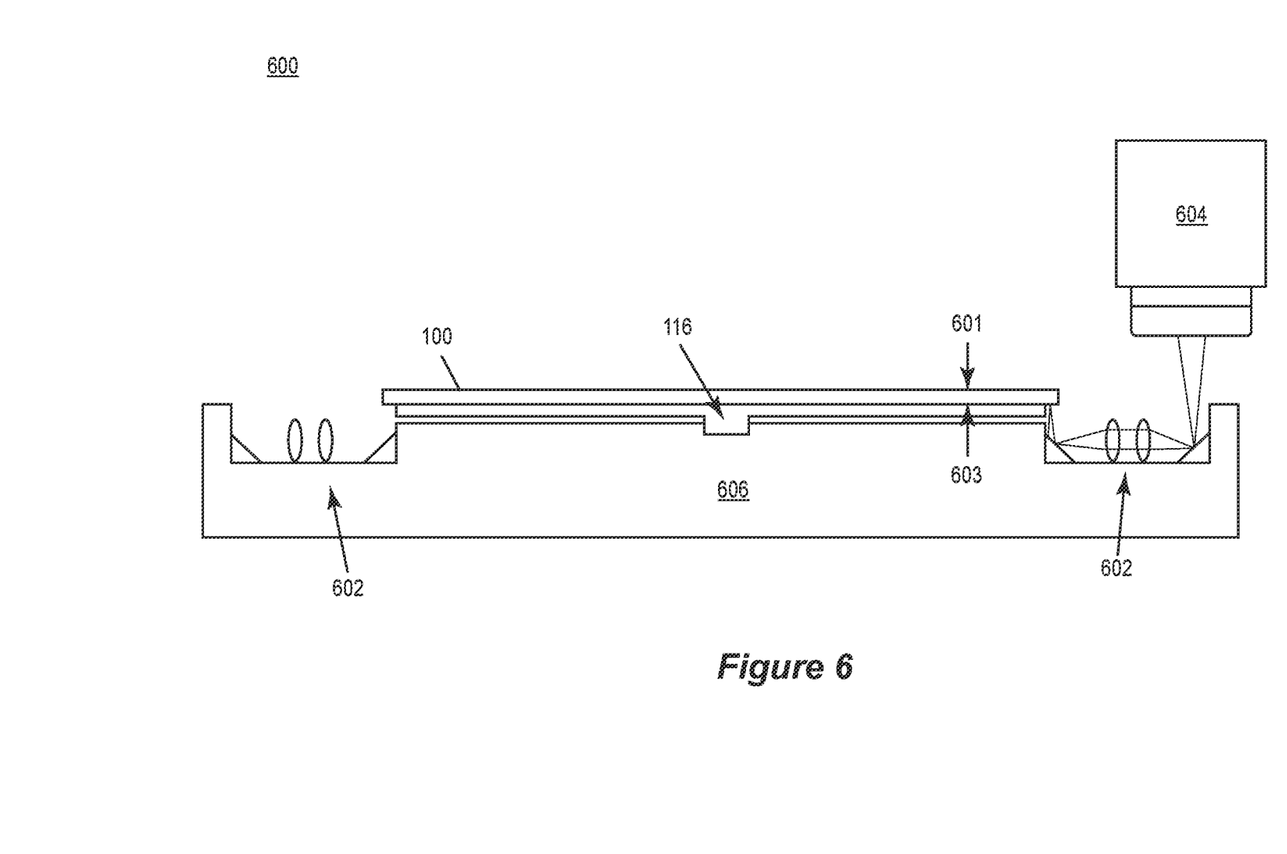
FIG. 6 illustrates an embodiment of an alignment system for aligned placement of the resulting plating preventative layer.

FIG. 6 illustrates an embodiment of an alignment system 600 for aligned placement of the resulting plating preventative layer 112. FIG. 6 provides a simplified view of both the wafer back and front sides 601, 603. Backside and/or frontside alignment may be obtained using optical projection. The alignment system 600 includes alignment marks (not visible) on the wafer frontside 603 (face down) and that are imaged using two or more optical modules 602 embedded below the wafer chuck 116. The alignment marks may be formed by etching into the semiconductor material or oxide, or by leaving an oxide bridge behind. In another example, the alignment marks may be formed by a piece of metal from the front-side metal patterning process.

A frontside alignment camera 604 may be used to detect the alignment marks on the wafer frontside 603. Determination of any offsets due the optics may be achieved with a standard wafer having front and back side alignment marks placed thereon using a back-to-front alignment exposure system.

By registering antipodal marks on the wafer frontside 603, either in the x or y direction, the wafer rotation and the x or y printing coordinates may be calculated. After first printing, and depending on the type of stage 606 used, the semiconductor wafer 100 may be either directly rotated by 90° and printed, or else removed from the chuck 116, repositioned at a 90° offset and the alignment process repeated.

FIG. 6 shows alignment on the very edge of the semiconductor wafer 100. However, with slots cut into the stage 606, inspection further into the wafer 100 away from the perimeter is possible. In one embodiment, the alignment-print method includes measuring the angle and offset and printing accordingly. In another embodiment, the alignment-print method includes manually shifting the wafer 100 until the kerf region 106 arrives at a fixed point. Yet another option includes a large enough field of view to catch all alignment marks.

The embodiments described herein may provide energy saving and mitigation of energy use, by reducing usage of resources. For example, less plated metal is formed on the semiconductor wafer 100.

Although the present disclosure is not so limited, the following numbered examples demonstrate one or more aspects of the disclosure.

Example 1. A method of processing a semiconductor wafer, the method comprising: forming a first metal layer or metal layer stack on a backside of the semiconductor wafer; forming a plating preventative layer on the first metal layer or metal layer stack, the plating preventative layer being formed at least over a kerf region of the semiconductor wafer and such that part of the first metal layer or metal layer stack is uncovered by the plating preventative layer, wherein the kerf region defines an area for dividing the semiconductor wafer along the kerf region into individual semiconductor dies; and plating a second metal layer or metal layer stack on the part of the first metal layer or metal layer stack uncovered by the plating preventative layer, wherein the plating preventative layer prevents plating of the second metal layer or metal layer stack over the kerf region.

Example 2. The method of example 1, wherein the first metal layer or metal layer stack comprises one or more selected from the group consisting of: Al, Cu, Ti, W, Mo, Cr, Ni, Ag, Au, Pt, Pd, Sn, Zn, and alloys thereof.

Example 3. The method of example 1 or 2, wherein the second metal layer or metal layer stack comprises one or more selected from the group consisting of: Ni, NiP, NiMoP, NiB, NiWP, Ag, AgP, Cu, Pd, PdP, Au, Sn, Pt, CoW, In, Ir, Ru, Rh, and alloys thereof.

Example 4. The method of any of examples 1 through 3, wherein the plating preventative layer is an oxide layer or comprises a polymer.

Example 5. The method of example 4, wherein the polymer is an organic polymer.

Example 6. The method of example 4, wherein the polymer comprises silicone.

Example 7. The method of any of examples 1 through 6, wherein forming the plating preventative layer on the first metal layer or metal layer stack comprises: printing a plating preventative material at least over the kerf region.

Example 8. The method of example 7, wherein the plating preventative material is printed by stencil printing, screen printing, inkjet printing, aerosol printing or electrohydrodynamic printing.

Example 9. The method of any of examples 1 through 8, wherein forming the plating preventative layer on the first metal layer or metal layer stack comprises: locating alignment structures formed on a frontside of the semiconductor wafer; and forming the plating preventative layer in alignment with the alignment structures.

Example 10. The method of any of examples 1 through 9, wherein the plating preventative layer is thinner than the second metal layer or metal layer stack.

Example 11. The method of any of examples 1 through 10, further comprising: electrically coupling the backside of each semiconductor die to a same electric potential via the first metal layer or metal layer stack as part of an electrical test performed on the semiconductor wafer; and after performing the electrical test, dividing the semiconductor wafer into individual semiconductor dies along the kerf region.

Example 12. A semiconductor wafer, comprising: a semiconductor material; a first metal layer or metal layer stack formed on a backside of the semiconductor material; a plating preventative layer formed on the first metal layer or metal layer stack at least over a kerf region of the semiconductor wafer such that part of the first metal layer or metal layer stack is uncovered by the plating preventative layer; and a second metal layer or metal layer stack plated on the part of the first metal layer or metal layer stack uncovered by the plating preventative layer, wherein the plating preventative layer keeps the kerf region free from the second metal layer or metal layer stack.

Example 13. The semiconductor wafer of example 12, wherein the kerf region defines an area for dividing the semiconductor wafer along the kerf region into individual semiconductor dies.

Example 14. The semiconductor wafer of example 12 or 13, wherein the plating preventative layer is an oxide layer or comprises a polymer.

Example 15. The semiconductor wafer of any of examples 12 through 14, wherein the plating preventative layer is thinner than the second metal layer or metal layer stack.

Example 16. The semiconductor wafer of any of examples 12 through 15, wherein the semiconductor material has a thickness of 200 μm or less.

Example 17. The semiconductor wafer of any of examples 12 through 16, wherein a hardness of the second metal layer or metal layer stack is different than a hardness of the first metal layer or layer stack.

Example 18. A semiconductor die, comprising: a semiconductor substrate; a first metal layer or metal layer stack formed on a backside of the semiconductor substrate; a plating preventative layer formed on the first metal layer or metal layer stack at least over a periphery region of the backside such that at least part of the first metal layer or metal layer stack spaced inward from the periphery region is uncovered by the plating preventative layer; and a second metal layer or metal layer stack plated on the part of the first metal layer or metal layer stack uncovered by the plating preventative layer.

Example 19. The semiconductor die of example 18, wherein the plating preventative layer is an oxide layer or comprises a polymer.

Example 20. The semiconductor die of example 18 or 19, wherein the plating preventative layer is thinner than the second metal layer or metal layer stack.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor wafer, comprising:
a semiconductor material;
a first metal layer or metal layer stack formed on a backside of the semiconductor material;
a plating preventative layer formed on the first metal layer or metal layer stack at least over a kerf region of the semiconductor wafer such that part of the first metal layer or metal layer stack is uncovered by the plating preventative layer; and
a second metal layer or metal layer stack plated on the part of the first metal layer or metal layer stack uncovered by the plating preventative layer,
wherein the plating preventative layer keeps the kerf region free from the second metal layer or metal layer stack.

2. The semiconductor wafer of claim 1, wherein the kerf region defines an area for dividing the semiconductor wafer along the kerf region into individual semiconductor dies.

3. The semiconductor wafer of claim 1, wherein the plating preventative layer is an oxide layer or comprises a polymer.

4. The semiconductor wafer of claim 3, wherein the polymer is an organic polymer.

5. The semiconductor wafer of claim 3, wherein the polymer comprises silicone.

6. The semiconductor wafer of claim 1, wherein the plating preventative layer is thinner than the second metal layer or metal layer stack.

7. The semiconductor wafer of claim 6, wherein the plating preventative layer has a thickness of at least 100 nm.

8. The semiconductor wafer of claim 1, wherein the semiconductor material has a thickness of 200 μm or less.

9. The semiconductor wafer of claim 1, wherein a hardness of the second metal layer or metal layer stack is different than a hardness of the first metal layer or layer stack.

10. The semiconductor wafer of claim 1, wherein the second metal layer or metal layer stack extends laterally onto a portion of the plating preventative layer.

11. A semiconductor die, comprising:
a semiconductor substrate;
a first metal layer or metal layer stack formed on a backside of the semiconductor substrate;
a plating preventative layer formed on the first metal layer or metal layer stack at least over a periphery region of the backside such that at least part of the first metal layer or metal layer stack spaced inward from the periphery region is uncovered by the plating preventative layer; and
a second metal layer or metal layer stack plated on the part of the first metal layer or metal layer stack uncovered by the plating preventative layer.

12. The semiconductor die of claim 11, wherein the plating preventative layer is an oxide layer or comprises a polymer.

13. The semiconductor die of claim 12, wherein the polymer is an organic polymer.

14. The semiconductor die of claim 12, wherein the polymer comprises silicone.

15. The semiconductor die of claim 11, wherein the plating preventative layer is thinner than the second metal layer or metal layer stack.

16. The semiconductor die of claim 15, wherein the plating preventative layer has a thickness of at least 100 nm.

17. The semiconductor die of claim 11, wherein the semiconductor material has a thickness of 200 μm or less.

18. The semiconductor die of claim 11, wherein a hardness of the second metal layer or metal layer stack is different than a hardness of the first metal layer or layer stack.

19. The semiconductor die of claim 11, wherein the second metal layer or metal layer stack extends laterally onto a portion of the plating preventative layer.

* * * * *